United States Patent
Indyk et al.

(10) Patent No.: US 8,652,941 B2
(45) Date of Patent: Feb. 18, 2014

(54) WAFER DICING EMPLOYING EDGE REGION UNDERFILL REMOVAL

(75) Inventors: Richard F. Indyk, Wappingers Falls, NY (US); Jae-Woong Nah, New York, NY (US); Satoru Katsurayama, Utsunomiya (JP); Daisuke Oka, Shizuoka (JP); Shigefumi Okada, Raleigh, NC (US)

(73) Assignees: International Business Machines Corporation, Armonk, NY (US); Disco Corporation, Tokyo (JP); Sumitomo Bakelite Company Ltd., Tokyo (JP)

( * ) Notice: Subject to any disclaimer, the term of this patent is extended or adjusted under 35 U.S.C. 154(b) by 0 days.

(21) Appl. No.: 13/474,090

(22) Filed: May 17, 2012

(65) Prior Publication Data

US 2013/0149841 A1    Jun. 13, 2013

Related U.S. Application Data

(60) Provisional application No. 61/568,379, filed on Dec. 8, 2011, provisional application No. 61/605,396, filed on Mar. 1, 2012.

(51) Int. Cl.
  *H01L 21/78*   (2006.01)
  *H01L 21/46*   (2006.01)
  *H01L 21/301*  (2006.01)
  *H01L 21/44*   (2006.01)
  *H01L 21/50*   (2006.01)

(52) U.S. Cl.
  USPC ........... 438/463; 438/462; 438/460; 438/613; 438/113

(58) Field of Classification Search
  USPC .......................... 438/460, 462, 463, 613, 113
  See application file for complete search history.

(56) References Cited

U.S. PATENT DOCUMENTS

| | | | | |
|---|---|---|---|---|
| 5,726,502 | A * | 3/1998 | Beddingfield | 257/797 |
| 6,338,980 | B1 * | 1/2002 | Satoh | 438/106 |
| 6,607,970 | B1 * | 8/2003 | Wakabayashi | 438/462 |
| 7,183,191 | B2 * | 2/2007 | Kinsman et al. | 438/613 |
| 7,829,381 | B2 | 11/2010 | Katoh | |
| 7,838,424 | B2 * | 11/2010 | Karta et al. | 438/689 |
| 8,063,495 | B2 * | 11/2011 | Miyata et al. | 257/781 |
| 2006/0079025 | A1 * | 4/2006 | Kripesh et al. | 438/113 |
| 2008/0265445 | A1 | 10/2008 | Feger et al. | |
| 2009/0102070 | A1 | 4/2009 | Feger et al. | |
| 2009/0108472 | A1 | 4/2009 | Feger et al. | |

FOREIGN PATENT DOCUMENTS

| | | |
|---|---|---|
| JP | 2007-335424 | 12/2007 |
| JP | 2009-135308 | 6/2009 |

* cited by examiner

*Primary Examiner* — Luan C Thai

(74) *Attorney, Agent, or Firm* — Scully, Scott, Murphy & Presser, P.C.; Louis J. Percello, Esq.

(57) ABSTRACT

In one embodiment, a dielectric material layer embedding metal structures is ablated from the chip-containing substrate by laser grooving, which is performed on dicing channels of the chip-containing substrate. Subsequently, an underfill layer is formed over the dielectric material layer in a pattern that excludes the peripheral areas of the chip-containing substrate. The physically exposed dicing channels at the periphery can be employed to align a blade to dice the chip-containing substrate. In another embodiment, an underfill layer is formed prior to any laser grooving. Mechanical cutting of the underfill layer from above dicing channels is followed by laser ablation of the dicing channels and subsequent mechanical cutting to dice a chip-containing substrate.

25 Claims, 10 Drawing Sheets

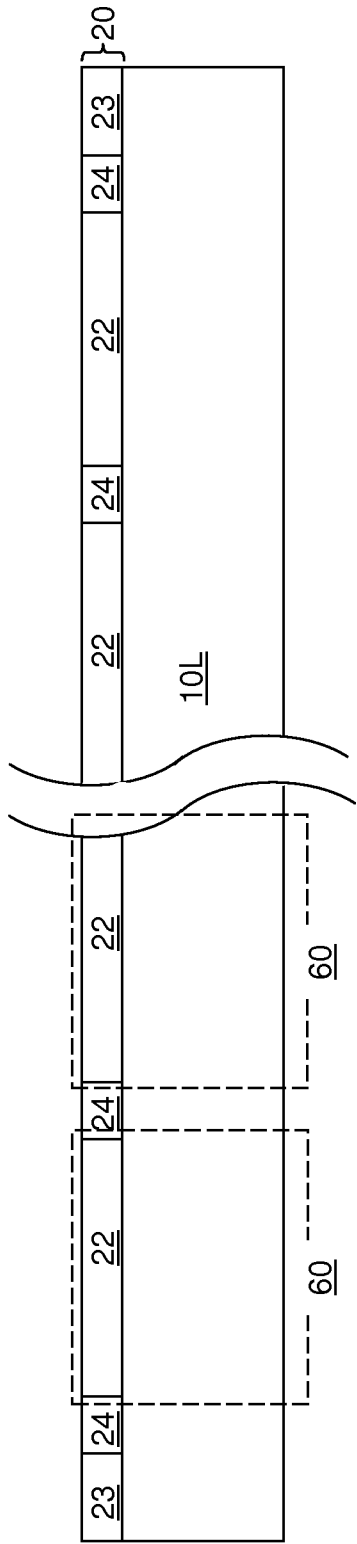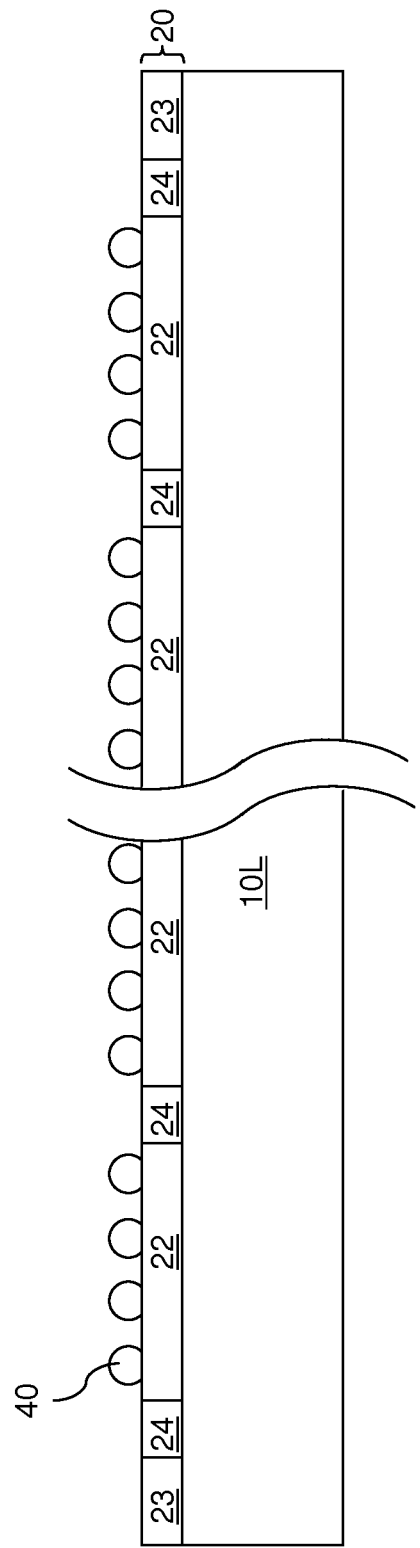

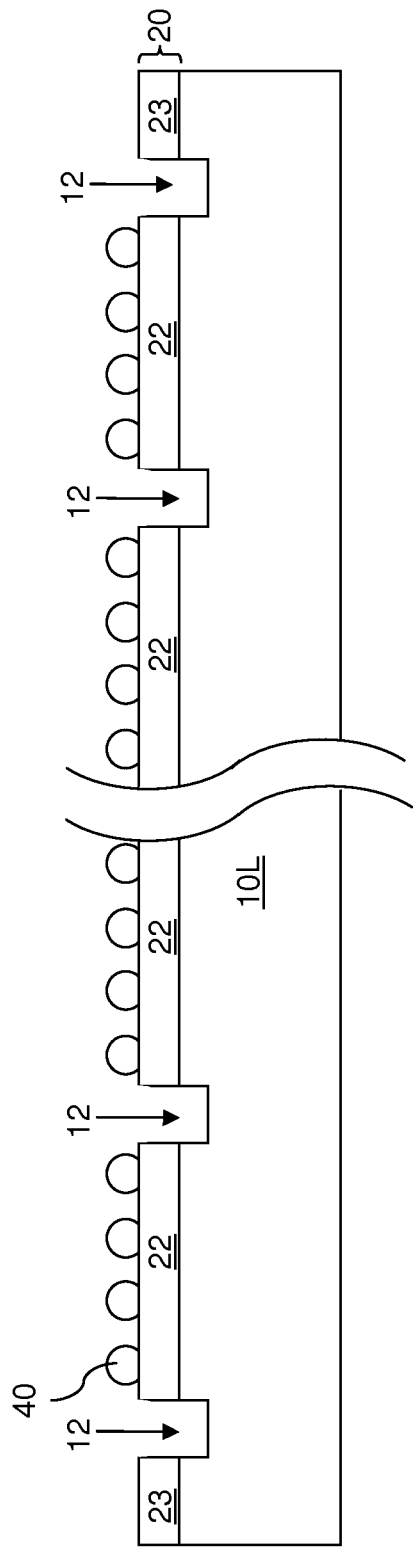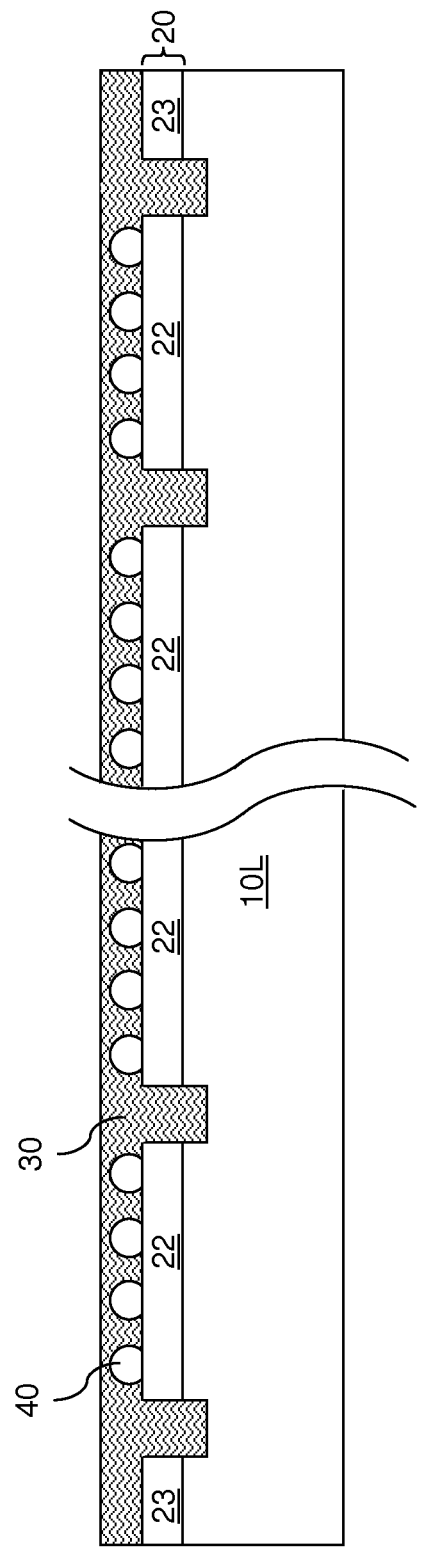

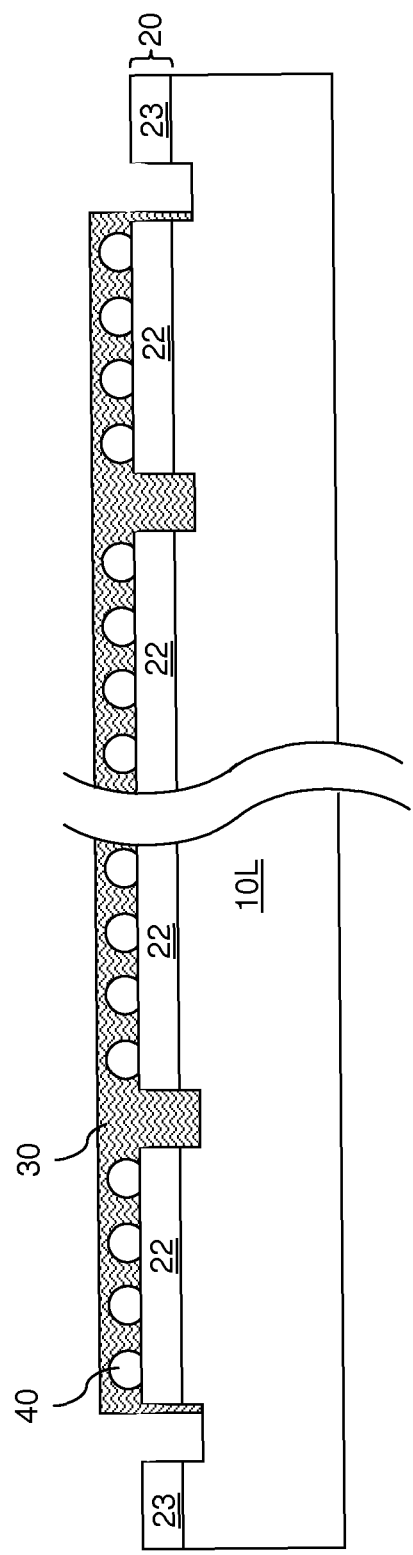

WAFER DICING EMPLOYING EDGE REGION UNDERFILL REMOVAL

CROSS REFERENCE TO RELATED APPLICATION

The instant application claims the benefit of priority from Provisional Application Ser. No. 61/568,379 filed on Dec. 8, 2011 and from Provisional Application Ser. No. 61/605,396 filed on Mar. 1, 2012, the entire contents of which are incorporated herein by reference.

BACKGROUND

The present disclosure relates to a method for dicing substrates, and particularly, to a method of dicing substrate with solder bumps and an underfill layer thereupon.

Dicing is a process in which a chip-containing substrate is cut into individual dies. The chip-containing substrate typically includes a vertical stack of a semiconductor substrate including semiconductor devices and a metal interconnect structure-containing layer including dielectric material layers and metal interconnect structures embedded therein. Each die typically includes a semiconductor chip, and can be subsequently bonded with another substrate in a bonding process such as flip chip assembly. A diamond blade dicing process has been used in the industry for singulation of dies from the chip-containing substrate.

A chip-containing substrate includes a semiconductor device layer and a metal interconnect layer that includes metal interconnect structures embedded in a dielectric material layer. Recently, low dielectric constant (low-k) dielectric materials having a dielectric constant less than 3.9 (the dielectric constant of silicon oxide) and porous ultra low-k dielectric materials having a dielectric constant less than 2.8 layers have been employed as the dielectric material embedding the metal interconnect structures. Because such low-k and ultra low-k dielectric materials are prone to structural damage during laser dicing, formation of grooves in the dielectric material layer embedding metal interconnect structures has been recently proposed. Specifically, a laser grooving process can be performed first on the active side of the chip-containing substrate, i.e., the side at which the dielectric material layer embedding metal interconnect structures are located. Low-k and/or ultra low-k dielectric material layers and metallic structures in the dicing channels are ablated by a laser beam. The metallic structures in the dicing channels typically include test structures and alignment structures, and are referred to as kerf structures. Full singulation of the dies is accomplished by cutting through the remaining portion of the chip-containing substrate, i.e., the semiconductor substrate, in the dicing streets with a diamond saw process.

The two step die singulation process of laser ablation followed by diamond saw dicing requires that the dicing channels are visible for laser grooving. The two step die singulation process can be employed for conventional wafers, i.e., chip-containing substrates, which do not employ a wafer level underfill (WLU) material. As used herein, a "wafer level underfill," an "underfill," an "underfill material," or "WLU" refers to a underfill material that is applied on a wafer surface or over an array of solder bumps on a wafer, i.e., a chip-containing substrate prior to singulation of the dies therein. However, underfill materials at a thickness comparable with the height of solder bumps (balls), which have a diameter on the order of 10~100 microns, are optically opaque. Thus, the two step die singulation process is not compatible with application of an underfill material (such as wafer level underfill (WLU) as known in the art) prior to singulation.

Specifically, when a wafer level underfill is applied on a wafer, it is very difficult to use the normally used laser grooving method which is critical to prevent damage induced on brittle low K and ultra low K dielectric layers during the wafer sawing process and subsequent solder reflow chip join process for the following reasons.

Firstly, the laser grooving process needs very precise control in positioning of the laser beam to avoid hitting active features on closely spaced die. The WLU is coated almost the same height as the interconnection solder bumps or slightly thicker than the solder bump height, so even though the transparency of B-stage cured WLU can be good enough to see the solder bumps through a thickness of a few microns, the dicing marks are not visible through the thickness on the order of 10~100 microns. Thus, once the WLU is pre-applied on the wafer, the dicing marks on the active surface of wafer, i.e., on the surface of the semiconductor substrate, are not visible.

Secondly, compared to blade dicing which uses cooling wafer during wafer sawing process, laser grooving does not use any cooling source and the temperature during laser grooving reaches a localized temperature of at least 1,420 degrees Celsius (melting point of Si). Therefore, laser grooving after a WLU coating has been applied to the wafer causes melting and curing of WLU material near the ablation groove edge. The high temperature of laser ablation process results in a very wide heat affected zone, which typically reaches the solder bump areas. Melting and curing of the WLU material necessarily occurs adjacent to the ablation path. The altered physical state of the WLU material affects the flow and curing of WLU during the subsequent flip chip assembly process.

Therefore, there is a need for a singulation method that is compatible with a substrate having an array of solder bumps and a wafer level underfill (WLU) material thereupon.

BRIEF SUMMARY

An array of solder bumps is formed on each full semiconductor chip on a chip-containing substrate. In one embodiment, a dielectric material layer embedding metal structures is ablated from the chip-containing substrate by laser grooving, which is performed on dicing channels of the chip-containing substrate. Subsequently, an underfill layer is formed over the dielectric material layer in a pattern that excludes the peripheral areas of the chip-containing substrate. The physically exposed dicing channels at the periphery of the chip-containing substrate can be employed to align a blade to be employed to dice the remaining portions of the chip-containing substrate underneath each dicing channel.

Laser grooving lines in the dielectric material layer can be formed with precision by employing normal lithography-defined dicing marks for positioning a laser beam. The resulting laser grooves can be relatively shallow, and typically extend from 5 to 15 microns into the semiconductor substrate. The depth of the grooves does not impede spin coating or spray coating of the underfill after the laser grooving process. During subsequent cutting of the chip-containing substrate, a cutting blade can be cooled, for example, by coolants, thereby preventing formation of any heat-affected zone on either side of the blade or damage to adjacent underfill material portions.

In another embodiment, an underfill layer is formed prior to any laser grooving. A cutting blade is employed to remove the underfill layer from above dicing channels, followed by laser ablation of the dicing channels and subsequent mechanical cutting of the remaining portion of the chip-containing substrate.

For example, a first groove is formed on an underfill layer by mechanical cutting without generating thermal damage on the underfill layer. A second groove is formed in a dielectric material layer exposed, and/or visible, underneath the first groove by means of a laser radiation without mechanical damage on the dielectric material layer, which can include a porous dielectric material. The semiconductor substrate underneath can be subsequently singulated into dies by mechanical cutting.

According to an aspect of the present disclosure, a method of manufacturing a semiconductor structure is provided. The method includes: forming a dielectric material layer embedding metal interconnect structures on a surface of a semiconductor substrate; forming a groove in the dielectric material layer along a dicing channel by laser irradiation; forming an underfill layer on the dielectric material layer; and singulating, after forming the underfill layer, the semiconductor substrate into dies by cutting the semiconductor substrate along the dicing channel.

BRIEF DESCRIPTION OF THE SEVERAL VIEWS OF THE DRAWINGS

FIG. 1 is a schematic vertical cross-sectional view of a first exemplary structure including a substrate, which includes a stack of a semiconductor substrate and a dielectric material layer embedding metal interconnect structures according to a first embodiment of the present disclosure.

FIG. 2 is a schematic vertical cross-sectional view of the first exemplary structure after formation of arrays of solder bumps on the metal interconnect structures embedded within the dielectric material layer according to an embodiment of the present disclosure.

FIG. 4 is a schematic vertical cross-sectional view of the first exemplary structure of FIG. 3.

FIG. 5 is a schematic vertical cross-sectional view of the first exemplary structure after application of an underfill layer according to the first embodiment of the present disclosure.

FIG. 6 is a schematic vertical cross-sectional view of the first exemplary structure after removal of a peripheral portion of the underfill layer around the periphery of the substrate according to the first embodiment of the present disclosure.

DETAILED DESCRIPTION

Figure 3:
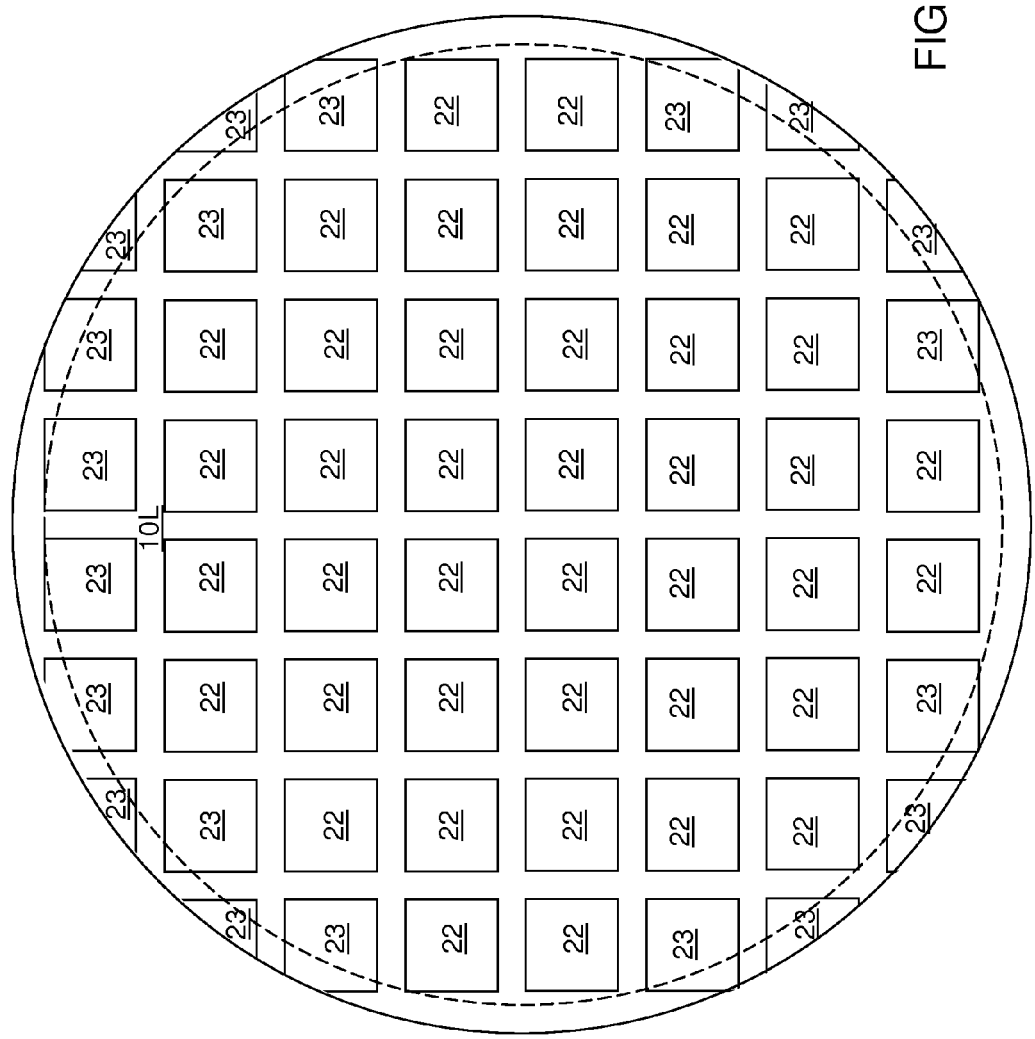
FIG. 3 is a schematic top-down view of the first exemplary structure after formation of grooves through the dielectric material layer and an upper portion of the semiconductor substrate according to an embodiment of the present disclosure.

As stated above, the present disclosure relates to a method of dicing substrate with solder bumps and an underfill layer thereupon, which is now described in detail with accompanying figures. It is noted that like and corresponding elements are referred to by like reference numerals. The drawings are not in scale.

Referring to FIG. 1, a first exemplary structure according to a first embodiment of the present disclosure includes a substrate, which is a composite substrate including a stack of a semiconductor substrate 10L and a dielectric material layer 20 embedding metal interconnect structures (not expressly shown). The semiconductor substrate 10L includes a semiconductor material such as silicon, germanium, a silicon-germanium alloy, or any composite semiconductor material known in the art. At least one semiconductor device (not expressly shown) is formed on an upper surface of the semiconductor substrate 10L employing methods known in the art. The semiconductor substrate 10L can include a plurality of dies including semiconductor devices and not including metal interconnect structures.

The dielectric material layer 20 can include a single dielectric material or a plurality of different dielectric materials. Metal interconnect structures (not expressly shown) such as metal lines and metal vias are formed within the dielectric material layer 20. In one embodiment, the dielectric material layer 20 includes a plurality of layered metal interconnect levels. Arrays of first metallic pads (not expressly shown) can be formed in the uppermost portion of the dielectric material layer employing methods known in the art.

The dielectric material layer 20 includes multiple regions, which include a plurality of full chip metal interconnect structure regions 22, partial chip metal interconnect structure regions 23 that are located on the periphery of the substrate (10L, 20) and having an area less than the size of a full chip, and kerf regions 24 (i.e., dicing channel regions) that are located between adjacent pairs of full or partial chip metal interconnect structure regions (22, 23). Each full chip metal interconnect structure region 22 overlies a full semiconductor chip region located within the semiconductor substrate and including a set of semiconductor devices for a semiconductor chip 60. Each vertically abutting pair of a full semiconductor chip region and a full chip metal interconnect structure region 22 constitutes the semiconductor chip 60, which is subsequently diced.

In one embodiment, the dielectric material layer 20 can include at least one porous dielectric material or an air gap, which can be present as one or more porous dielectric material layers (not expressly shown) located within the dielectric material layer 20. For example, the at least one porous dielectric material can be an organosilicate glass (OSG) material including Si, C, O, H, and optionally N, a porous dielectric organic polymer material, SiLK™, or any other porous low dielectric constant (low-k) dielectric material having a dielectric constant less than 2.8 as known in the art. Alternately or additionally, air gap having a dielectric constant 1 can be used. Each of the at least one porous dielectric material can be formed by any method for depositing a porous dielectric material as known in the art including, but not limited to, spin-coating and chemical vapor deposition (CVD). In addition, the dielectric material layer 20 can optionally include at least one non-porous dielectric material such as silicon oxide, silicon nitride, and/or silicon oxynitride.

The arrays of first metallic pads are formed in the uppermost portion of the dielectric material layer 20, for example, by deposition and patterning of a metallic material. Within each semiconductor chip 60, a set of metal interconnect structures embedded within a full chip metal interconnect structure region 22 provides electrical contact between semiconductor devices within the portion of the semiconductor substrate 10L corresponding to the semiconductor chip 60 and an array of first metallic pads located in the uppermost portion of the full chip metal interconnect structure region 22.

In one embodiment, the uppermost portion of the dielectric material layer 20 can optionally include a protective dielectric material layer through which the arrays of first metallic pads are physically exposed. In one embodiment, the protective dielectric material layer can include a polyimide resin or an epoxy resin.

Referring to FIG. 2, an array of solder bumps 40 is formed on each array of first metallic pads that overlie the metal interconnect structures embedded within the dielectric material layer 20. Each solder bump 40 is formed on a first metallic pad employing methods known in the art. Bump limiting metallurgy (BLM) can be applied between solder bump and a first metallic pad. The arrays of solder bumps 40 are formed over the dielectric material layer 20. In one embodiment, the shape of the solder bumps 40 can be spherical, cylindrical, or polygonal. The solder bumps 40 can include for example, at least two elements selected from tin, silver, gold, lead, zinc, bismuth, indium, and copper. Optionally, Copper bumps or Copper bumps with solder caps can be used instead of solder bumps.

The lateral dimension of the first metallic pads can be on the order of about 10~100 microns. The height of the solder bumps 40 can be on the order of about 10~100 microns. The solder bumps 40 can be formed only over the full chip metal interconnect structure regions 22, or over the full chip metal interconnect structure regions 22 and the partial chip metal interconnect structure regions 23.

Referring to FIGS. 3 and 4, grooves 12 are formed through the dielectric material layer 20 and optionally through an upper portion of the semiconductor substrate 10 by laser irradiation. FIG. 3 is a top-down view in which representation of solder bumps 40 is omitted for clarity, and FIG. 4 is a vertical cross-sectional view.

The grooves 12 are formed through the dielectric material layer 20 by removing center portions, or all, of the kerf regions 24 selective to the full chip metal interconnect structure regions 22 and the partial chip metal interconnect structure regions 23. In other words, the full chip metal interconnect structure regions 22 and the partial chip metal interconnect structure regions 23 are not removed by the laser irradiation. Thus, the grooves 12 are formed along dicing channels of the substrate (10L, 20) that correspond to lateral boundaries between adjacent pairs of semiconductor chips 60 (See FIG. 1).

Each groove 12 can extend from a portion of a periphery located one side of the semiconductor substrate to another portion of the periphery located at an opposite side of the semiconductor substrate 10L. Formation of each groove 12 can be performed by a single scanning of laser irradiation over the region of the groove 12, or can be performed by repeating laser irradiation for a plurality of times.

In one embodiment, the grooves 12 can be arranged in a lattice pattern. In one embodiment, each groove 12 can extend in a straight line from one end to another end. The grooves 12 are arranged, for example, in lattice on the wafer.

Referring to FIG. 5, an underfill layer 30 including an underfill material is applied over the substrate (10L, 20) and the arrays of the solder bumps 40. The underfill layer 30 is applied directly on the solder bumps 40. In one embodiment, the underfill layer 30 can be formed over the entirety of the semiconductor substrate 10L and the grooves 12. In one embodiment, the underfill layer 30 can fill the entirety of the grooves 12 upon formation of the underfill layer 30. The underfill layer 30 can be formed, for example, employing at least one of printing, spin coating, spray coating, squeeze coating, and film lamination of the underfill material.

In one embodiment, the underfill material includes a resin. In one embodiment, the underfill layer 30 can contain a thermocurable resin. Non-limiting exemplary thermocurable resins include, for example, an epoxy resin, a bismaleimide-triazine (BT) resin, a cyanate resin, and an acrylic resin. In addition, the resin composition may optionally contain an inorganic filler and/or a coupling agent.

In one embodiment, a resin composition can be applied over the substrate (10L, 20) and the arrays of the solder bumps 40, and subsequently B-staged to form a resin layer as the underfill layer 30. In one embodiment, the tackiness of the underfill layer 30 after B-staging can be 50 gf/5 mm$\phi$ or less. Therefore, workability, such as transferability and dicing ability, can be improved through reduction of the tackiness of the underfill material by B-staging of the resin composition. The tackiness of underfill layer 30 can be measured using, for example, using a tacking tester TAC-II manufactured by RHESCA CO., LTD. The tackiness measurement is performed, for example, as follows. First, an underfill layer 30 applied with a thickness of about 100 μm and an area of 15×60 mm on a substrate is B-staged under predetermined thermal conditions for a predetermined time period. Subsequently, a probe of 5 mm in diameter is pressed against the B-staged underfill layer at a pre-load of 50 gf for 1 second. Then, a load detected pulling the probe up at a rate of 600 mm/s is read as a tackiness value. The tackiness of the underfill layer 30 during heating can be measured by heating a stage or the probe.

In addition, the hardness H of the underfill layer 30 after B-staging as measured by a Berkovich indentation process can be higher than 30 MPa. Therefore, workability, such as transfer ability and dicing ability, can be improved through increasing the hardness of the underfill material by B-staging of the resin composition. The measurement of hardness H by a Berkovich indentation process may be performed using, for example, Universal Nanomechanical Tester (UNAT) manufactured by ASMEC. The measurement is performed as follows. First, an underfill layer 30 applied with a thickness of about 100 μm and an area of 15×60 mm on a substrate is B-staged under predetermined thermal conditions for a predetermined time period. Next, hardness H is calculated from the product between a load and a projected contact area when a conical indenter (the angle between the side of a triangular pyramid and the central axis thereof, $\alpha=65.27°$) is dropped onto the surface of the B-staged underfill layer at a constant rate.

Furthermore, the load F of the B-staged underfill layer 30 measured by a flat indentation process can be higher than 10 mN. Therefore, workability, such as transfer ability and dicing ability, can be improved through increasing the load F of the underfill material by B-staging of the resin composition. The measurement of hardness H by a flat indentation test may be performed using, for example, Universal Nanomechanical Tester (UNAT) manufactured by ASMEC. The measurement is performed as follows. First, an underfill layer applied with a thickness of about 100 µm and an area of 15×60 mm on a substrate is B-staged under predetermined thermal conditions for a predetermined time period. Subsequently, a relative evaluation of hardness is performed with respect to load when a flat indenter is brought into contact with the surface of the B-staged underfill layer.

Figure 7:
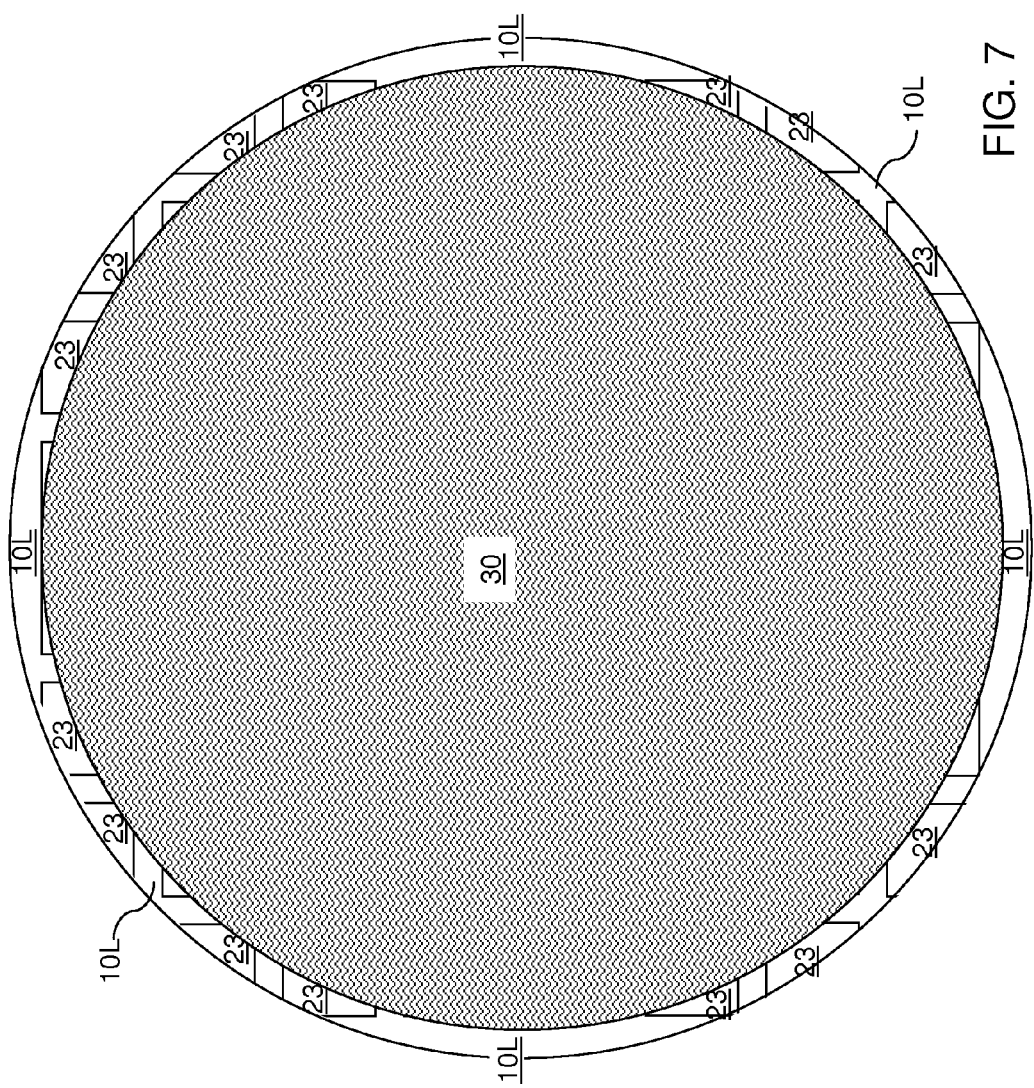
FIG. 7 is a schematic top-down view of the first exemplary structure of FIG. 6.

Referring to FIGS. 6 and 7, a peripheral portion of the underfill layer 30 is removed around the periphery of the substrate (10L, 20). Thus, the underfill layer 30 is patterned so that dicing channels are physically exposed within a peripheral region, i.e., the region of the substrate (10L, 20) that is not covered by the underfill layer 30, around a periphery of the semiconductor substrate 10L. End portions of the grooves 12 are physically exposed at the periphery of the semiconductor substrate 10L after removing the peripheral portion of the underfill layer 30.

In one embodiment, the peripheral portion of the underfill layer 30 can be removed around the entirety of the periphery of semiconductor substrate 10L. The peripheral portion of the underfill layer 30 can be removed by employing any suitable methods including chemical and mechanical methods.

In one embodiment, the peripheral portion of the underfill layer 30 can be removed by, for example, a blasting process using abrasives. Examples of the abrasives include alumina, sodium carbonate, glass powder, glass beads, walnut shell powder, and plastics shot.

In another embodiment, the peripheral portion of the underfill layer 30 can be removed by grinding the peripheral portion of the underfill layer 30 with mechanical instrumentation configured to grind materials. In yet another embodiment, the peripheral portion of the underfill layer 30 can be removed by irradiating a laser beam on the peripheral portion of the underfill layer 30.

In still another embodiment, the peripheral portion of the underfill layer 30 can be removed by dissolving the peripheral portion of the underfill layer 30 with a solvent, which can be an organic solvent selected to dissolve the underfill material and can be applied locally to remove the peripheral portion of the underfill material while avoiding a center region of the underfill layer 30. An exemplary organic solvent is acetone. Further, high pressure water can be used as solvent to remove the peripheral portion of the underfill layer 30.

Further, the peripheral portion of the underfill layer 30 can be removed by a diamond fly cutter, laser radiation, or any other means configured to mechanically, thermally, or chemically remove the underfill material from the peripheral portion of the underfill layer 30.

Peripheral portions of the grooves 12 (See FIG. 4) are physically exposed above the peripheral region of the substrate (10L, 20). The exposed portions of the grooves 12 can be employed as alignment marks in a subsequent step of singulating the substrate (10L, 20). In one embodiment, the dielectric material layer 20 as patterned at the step of FIGS. 3 and 4 is physically exposed along the entire circumference of the substrate (10L, 20). For example, the entire area of the substrate (10L, 20) can be removed from within a predefined distance, e.g., 3 mm, from the entire periphery of the semiconductor substrate 10L. Thus, the peripheral portion of the underfill layer 30 can be removed from a band region within a predetermined distance from around the periphery of the substrate (10L, 20).

The physically exposed end portions of the grooves 12 can be subsequently employed as alignment marks for subsequent mechanical singulation that employs a mechanical means for cutting the semiconductor substrate 10L. The mechanical means for cutting the semiconductor substrate 10L, e.g., a dicing saw, can be aligned employing physically exposed portion of the grooves within the peripheral region as an alignment mark.

In a variation of the first embodiment, removal of the peripheral portion of the underfill layer 30 along the entirety of the periphery of the semiconductor substrate 10L can be substituted with removal of multiple disjoined portions of the underfill layer 30 along a subset of the periphery of the semiconductor substrate 10L. In this case, end portions of the grooves 12 are physically exposed within disjoined patches of areas. In one embodiment, end portions of at least two parallel grooves 12 can be physically exposed within each peripheral portion from which the underfill material is removed. The distance between an adjacent pair of parallel grooves can be measured, and the center location of each groove 12 can be measured in order to align the mechanical means for cutting the semiconductor substrate 10L prior to singulating the semiconductor substrate 10L.

Figure 8:
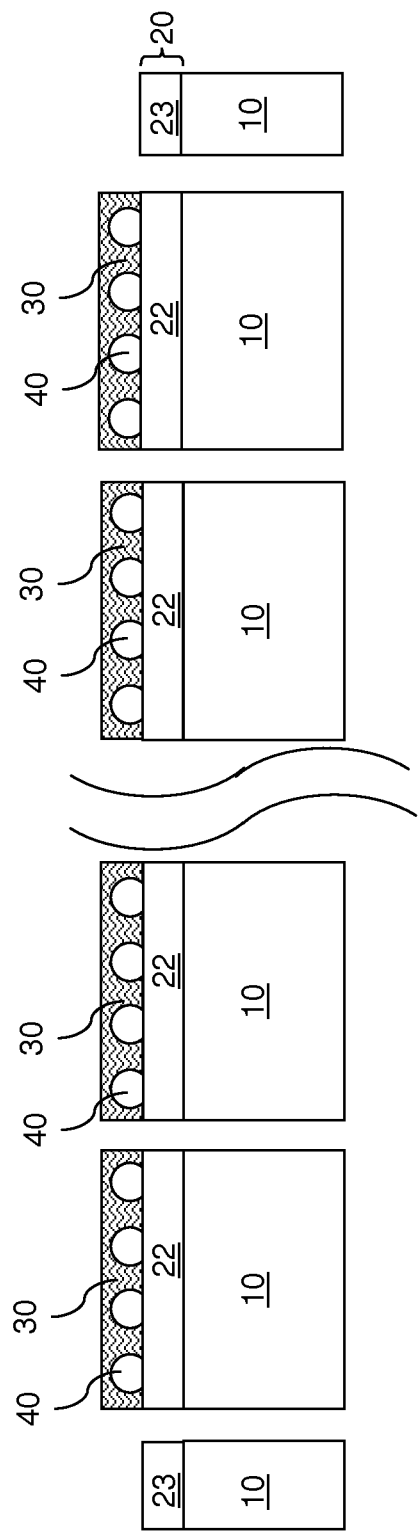
FIG. 8 is a schematic vertical cross-sectional view of the first exemplary structure after singulation of the substrate into a plurality of dies according to the first embodiment of the present disclosure.

Referring to FIG. 8, the semiconductor substrate 10L is singulated into dies by cutting the semiconductor substrate 10L along dicing channels. Specifically, the stack of the substrate (10L, 20), the solder balls 40, and the underfill layer 30 is singulated into a plurality of dies employing the mechanical means for cutting the semiconductor substrate 10L. A singulated full die includes a semiconductor portion 10 including semiconductor devices in an upper portion thereof, a full chip metal interconnect structure region 22, an array of solder bumps 40, and a portion of the underfill layer 30. The combination of the semiconductor portion 10 and the full chip metal interconnect structure region 22 constitutes a semiconductor chip 60. A plurality of full dies and a plurality of partial dies are formed. A partial die includes less than a full size semiconductor chip.

In one embodiment, the semiconductor substrate 10L can be optionally thinned from the back side, for example, by grinding, mechanical and/or chemical polishing, and/or wet etching of a lower portion (a back side portion) of the semiconductor substrate 10L. Optionally, minor finishing and/or planarizing a bottom surface of a thinned semiconductor substrate 10L can be employed. The mirror finishing and/or planarizing the bottom surface of a thinned semiconductor substrate 10L can be implemented by dry etching, dry polishing, wet etching, and/or a combination thereof on the bottom surface of the thinned semiconductor substrate 10L.

The singulation of the stack of the substrate (10L, 20), the solder balls 40, and the underfill layer 30 can be performed by dicing the semiconductor substrate 10L and the underfill layer 30. For example, the singulation of the stack of the substrate (10L, 20), the solder balls 40, and the underfill layer 30 can be performed by cutting the underfill layer 30 and the semiconductor substrate 10L at once or in several steps along the grooves 12. Optionally, a dicing tape (not shown) can be attached on the underfill layer 30 or on the bottom surface of the semiconductor substrate 10L prior to dicing.

In one embodiment, the method of singulating the stack of the substrate (10L, 20), the solder balls 40, and the underfill layer 30 can be blade dicing. In this case, the singulation is performed by dicing the semiconductor substrate 10L and the underfill layer 30 with a blade. By cutting the underfill layer 30 with blade dicing, irradiation of a laser beam onto the underfill layer 30 is avoided, thereby preventing thermal damage to the underfill layer 30.

In one embodiment, the singulation of the stack of the substrate (10L, 20), the solder balls 40, and the underfill layer 30 can be performed by dicing the stack from the front side to the back side of the semiconductor substrate 10L, i.e., from the interface between the semiconductor substrate 10L and the dielectric material layer 20 to the surface of the semiconductor substrate 10L that is located on the opposite side of the interface with the dielectric material layer 20. In other words, the dicing is performed by causing the blade to cut through the semiconductor substrate 10L from the front side surface of the semiconductor substrate 10L that is in contact with the dielectric material layer 20 to the back side surface of the semiconductor substrate 10L that is not in contact with the dielectric material layer 20.

A dicing tape can be optionally attached to the bottom surface of the semiconductor substrate 10L prior to dicing. In one embodiment, the underfill layer 30 and the semiconductor substrate 10L can be diced in a single dicing without interruption. Alternatively, the underfill layer 30 and the semiconductor substrate 10L can be diced by partially blade-dicing the underfill layer 30 and the semiconductor substrate 10L along the direction of the dicing channels (which coincide with the grooves 12), and subsequently cutting the semiconductor substrate 10L along the dicing channels by any of other techniques, which can include, for example, laser irradiation, cleaving by application of stress, and another round of blade dicing.

In one embodiment, the singulation of the stack of the substrate (10L, 20), the solder balls 40, and the underfill layer 30 can be performed by dicing the stack from the back side to the front side of the semiconductor substrate 10L, i.e., from the bottom surface of the semiconductor substrate 10L to the interface between the semiconductor substrate 10L and the dielectric material layer 20. In other words, the dicing is performed by causing the blade to cut through the semiconductor substrate 10L from the back side surface of the semiconductor substrate 10L that is not in contact with the dielectric material layer 20 to the front side surface of the semiconductor substrate 10L that is in contact with the dielectric material layer 20. Optionally, a dicing tape can be attached to the top surface of the underfill layer 30 prior to dicing to prevent scattering of diced semiconductor chips 60 upon singulation. In one embodiment, the semiconductor substrate 10L and the underfill layer 30 can be diced in a single dicing operation without interruption.

During the singulation of the stack of the substrate (10L, 20), the solder balls 40, and the underfill layer 30 by dicing, the dicing of the stack can be performed along all grooves 12 that are present in a lattice pattern on an upper surface of the semiconductor substrate 10L.

In one embodiment, the singulating can be performed by cutting through the underfill layer 30 and partially cutting the semiconductor substrate 10L from an interface with the underfill layer 30 to a depth within the semiconductor substrate 10L that is less than the thickness of the semiconductor substrate 30L. Thus, the underfill layer 30 and the semiconductor substrate 10L are partially diced along the grooves 12. Subsequently, a protective tape can be optionally attached to the top surface of the underfill layer 30. Then, the bottom surface of the semiconductor substrate 10L can be polished or ground up to the groove 12 formed in the upper portion of the semiconductor substrate 10L, thereby singulating the remaining portions of the stack of the substrate (10L, 20), the solder balls 40, and the underfill layer 30 into a plurality of semiconductor chips 60 with an array of solder balls 40 and a portion of the underfill layer 30 thereupon. The semiconductor substrate 10L is singulated when a polishing surface reaches the depth of the partial cut in the semiconductor substrate 10L.

Figure 9:
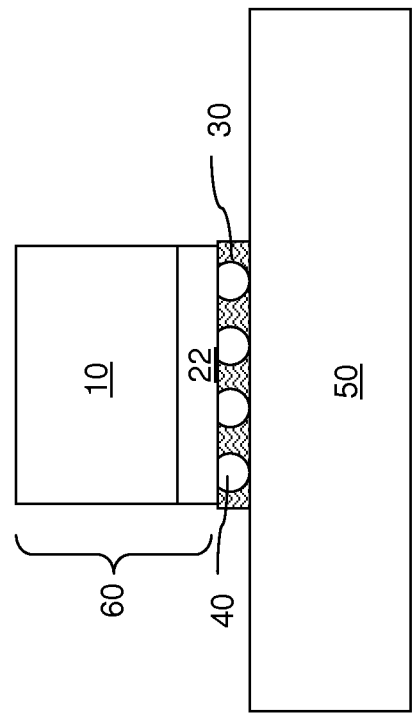
FIG. 9 is a schematic vertical cross-sectional view of an exemplary bonded structure employing a singulated die, a bonding substrate, an array of solder bumps, and a portion of the underfill layer according to an embodiment of the present disclosure.

Referring to FIG. 9, a bonded structure can be formed employing a singulated die (i.e., a semiconductor chip 60), a bonding substrate 50, an array of solder bumps 40 that is attached to the semiconductor chip 60, and a portion of the underfill layer 30 attached to the semiconductor chip 60. The bonding substrate 50 can be a wafer, another semiconductor chip (as singulated), a packaging substrate as known in the art, a circuit board, or an interposer structure. After the semiconductor chip 60 is bonded with the bonding substrate 50, the portion of the underfill layer on the semiconductor chip 60 is in physical contact with a surface of the bonding substrate 50. The formation of the bonded structure can employ a flip-chip bonding process in which the bonding substrate includes additional metallic pads (not shown), which is herein referred to as an array of second metallic pads. The array of second metallic pads can be embedded within the bonding substrate 50 such that top surfaces of the array of second metallic pads are physically exposed before bonding with the array of solder bumps 40, and physically contact, and bonded to, the array of solder bumps 40.

The bonding of the semiconductor chip 60 to the bonding substrate 50 can be performed as follows: First, the semiconductor chip 60 is aligned to the bonding substrate 50. At this time, a first surface of the semiconductor chip 60 in contact with the underfill layer 30 is arranged to face the side of the bonding substrate 50 that includes the array of second metallic pads. Next, the semiconductor chip 60 is brought into contact with the bonding substrate 50 through the under fill layer 30. At this time, the array of solder bumps 40 is brought into contact to the array of second metallic pads, which are electrodes mounted on an element-mounting side of the bonding substrate 50, by penetrating through the underfill layer 30. Subsequently, the semiconductor chip 60 and/or the bonding substrate 50 are heated at a temperature not lower than the melting point of the solder bumps 40. The array of solder bumps 40 is connected to the array of first metallic pads on the semiconductor chip 60 and the array of second metallic pads on the bonding substrate 50, thereby providing electrically conducting paths between the semiconductor chip 60 and the bonding substrate 50.

Figure 10:
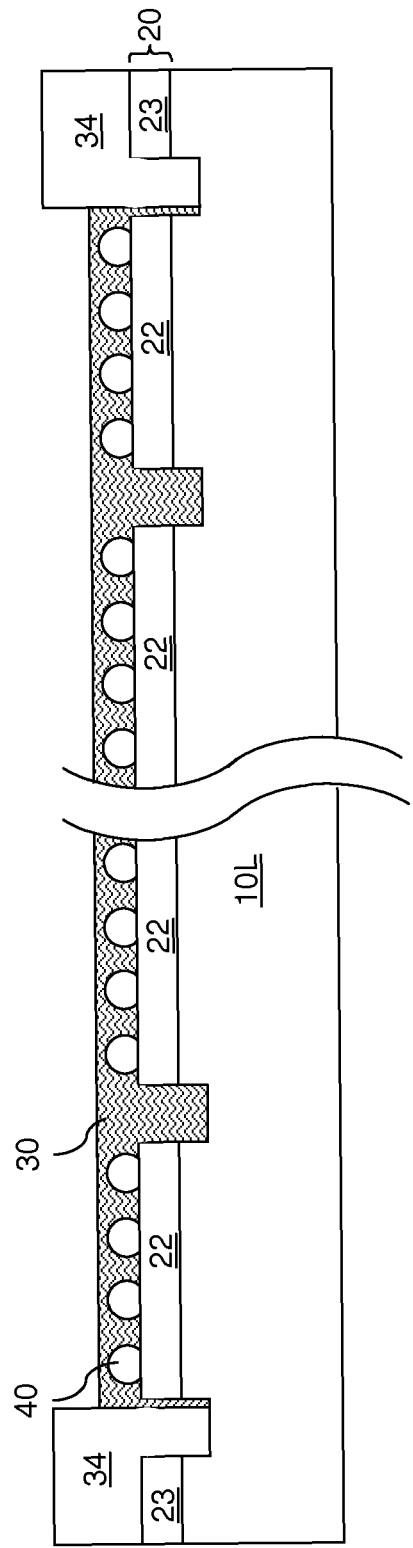
FIG. 10 is a schematic vertical cross-sectional view of a variation of the first exemplary structure after application of a mask layer and subsequent application of an underfill layer on the first exemplary structure of FIGS. 3 and 4 according to a variation of the first embodiment.

Referring to FIG. 10, a variation of the first exemplary structure according to a variation of the first embodiment is derived from the first exemplary structure of FIGS. 3 and 4 by applying a mask layer 34, and subsequently applying the underfill layer 30. In one embodiment, the mask layer 34 can be applied over the periphery of the semiconductor substrate 10L after forming the grooves 12 and prior to forming the underfill layer 30. The mask layer can be applied along the entirety of the periphery of the semiconductor substrate 10L. The underfill material is applied within a region bounded by the mask layer 34. The underfill layer 30 is formed by the application of the underfill material.

Subsequently, the mask layer 34 is removed. Upon removal of the mask layer 34, portions of the grooves 12 are physically exposed to provide the same structure as the first exemplary structure of FIGS. 6 and 7. The singulation can be performed in the same manner as in the first embodiment. In one embodiment, the singulation can be performed employing the physically exposed portions of the grooves 12 as alignment marks.

Figure 11:
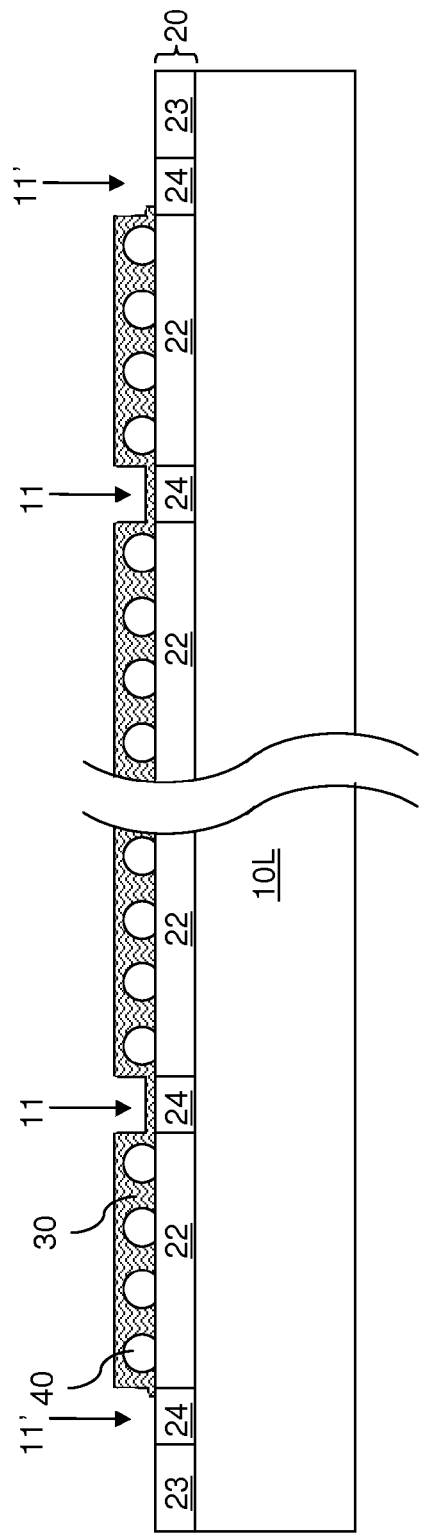
FIG. 11 is a schematic vertical cross-sectional view of a second exemplary structure after mechanical grooving of an underfill layer according to a second embodiment of the present disclosure.

Referring to FIG. 11, a second exemplary structure according to a second embodiment of the present disclosure is derived from the first exemplary structure of FIG. 5 (or a structure derived therefrom by removing peripheral portions of the underfill layer 30) by performing mechanical grooving of the underfill layer 30. The underfill layer 30 is cut by, for example, blade dicing to form underfill grooves 11 therein.

The underfill grooves 11 extend from the top surface of the underfill layer 30 to the bottom surface of the underfill layer 30, or to a height above the bottom surface of the underfill layer 30 such that the bottommost surface of the underfill grooves 11 can reliably stay above the bottom surface of the underfill layer 30. The vertical distance between the bottom surface of the underfill layer 30 and the bottommost surface of the underfill grooves 11 can be, for example, from 0 micron to 10 microns, although a greater vertical distance can also be employed. In this case, each underfill groove 11 overlies a kerf region 24.

Alternately, the underfill grooves 11 can extend partially into an upper portion of the dielectric material layer 20 provided that the upper portion of the dielectric material layer includes a non-porous dielectric material such as silicon oxide, silicon nitride, and/or silicon oxynitride and the underfill grooves 11 do not extend into any porous dielectric material regions located at a lower portion of the dielectric material layer 20. In this case, each underfill groove 11 partially extends into an upper portion of at least one kerf region 24.

Laser irradiation of the underfill layer 30 is avoided at this step in order to prevent thermal damages to the portions of the underfill material around the underfill grooves 11. Partial underfill grooves 11' may be formed at the periphery of the underfill layer 30 where a kerf region 24 laterally contacts a partial chip metal interconnect structure region 23. It is noted that laser irradiation of the underfill material causes thermal damage, and thermal damage of the underfill material is avoided by not employing laser irradiation during formation of the underfill grooves 11.

The underfill grooves 11 and partial underfill grooves 11' are formed in areas that overlie the dicing channels within the semiconductor substrate 10L. In one embodiment, the underfill grooves 11 and partial underfill grooves 11' can be formed in a grid pattern.

Figure 12:
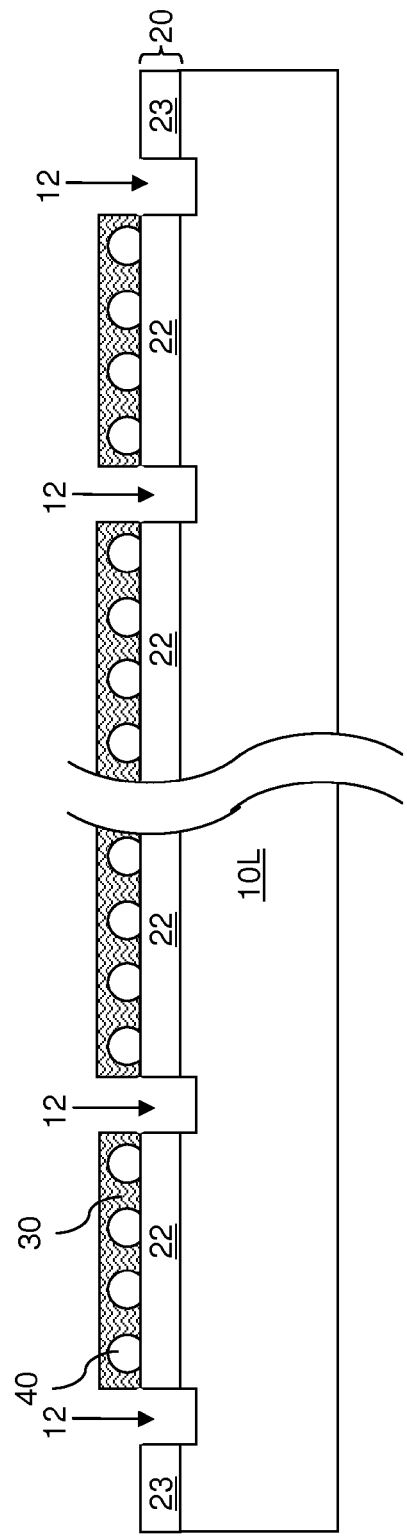
FIG. 12 is a schematic vertical cross-sectional view of the second exemplary structure after formation of grooves by laser ablation according to the second embodiment of the present disclosure.

Referring to FIG. 12, laser ablation is performed along the underfill grooves 11 and partial underfill grooves 11' to remove center portions, or all, of the kerf regions 24 selective to the full chip metal interconnect structure regions 22 and the partial chip metal interconnect structure regions 23. In other words, the full chip metal interconnect structure regions 22 and the partial chip metal interconnect structure regions 23 are not removed by the laser irradiation. The underfill grooves 11 and the partial underfill grooves 11' are extended downward to become grooves 12. Because the underfill grooves 11 and partial underfill grooves 11' are formed along dicing channels, the grooves 12 are formed along dicing channels of the substrate (10L, 20) that correspond to lateral boundaries between adjacent pairs of semiconductor chips 60 (See FIG. 1).

Any underfill material, if present at the bottom of the underfill grooves 11 and partial underfill grooves 11' prior to laser ablation, is ablated during the laser ablation that forms the grooves 12. By minimizing the thickness of any remaining underfill material at the bottom of the underfill grooves 11 and partial underfill grooves 11' during the blade dicing step of FIG. 11, the degree of thermal damage to remaining portions of the underfill material around the grooves 12 can be minimized.

In one embodiment, thickness of the underfill material at the bottom of the underfill grooves 11 and partial underfill grooves 11' at the end of the blade dicing step of FIG. 11 can be less than 10 microns. In another embodiment, thickness of the underfill material at the bottom of the underfill grooves 11 and partial underfill grooves 11' at the end of the blade dicing step of FIG. 11 can be less than 5 microns. In yet another embodiment, the thickness of the underfill material at the bottom of the underfill grooves 11 and partial underfill grooves 11' at the end of the blade dicing step of FIG. 11 can be less than 2 microns. In even another embodiment, the thickness of the underfill material at the bottom of the underfill grooves 11 and partial underfill grooves 11' at the end of the blade dicing step of FIG. 11 can be less than 1 micron. In still another embodiment, the thickness of the underfill material at the bottom of the underfill grooves 11 and partial underfill grooves 11' at the end of the blade dicing step of FIG. 11 can be less than 500 nm.

In a further embodiment, a wet etch or a dry etch can be employed to remove any remaining portion of the underfill material at the bottom of the underfill grooves 11 and partial underfill grooves 11' (See FIG. 11) so that a top surface of the dielectric material layer 20 is physically exposed at the bottom of each underfill groove 11 and each partial underfill groove 11'.

The grooves 12 extend into an upper portion of the semiconductor substrate 10L. By employing laser irradiation instead of blade cutting to cut through the dielectric material layer 20, damage to the porous dielectric material within the dielectric material layer 20 can be avoided.

Upon formation of the second exemplary structure of FIG. 12, a mechanical singulation method can be employed to singulated the semiconductor substrate 10L. Specifically, the semiconductor substrate 10L is singulated into dies by cutting the semiconductor substrate 10L along dicing channels. Specifically, the semiconductor substrate 10L is singulated into a plurality of dies employing the mechanical means for cutting the semiconductor substrate 10L. A singulated full die includes a semiconductor portion 10 including semiconductor devices in an upper portion thereof, a full chip metal interconnect structure region 22, an array of solder bumps 40, and a portion of the underfill layer 30 as illustrated in FIG. 9. The combination of the semiconductor portion 10 and the full chip metal interconnect structure region 22 constitutes a semiconductor chip 60. A plurality of full dies and a plurality of partial dies are formed. A partial dies includes less than a full size semiconductor chip.

In one embodiment, the semiconductor substrate 10L can be optionally thinned from the back side, for example, by grinding, mechanical and/or chemical polishing, and/or wet etching of a lower portion (a back side portion) of the semiconductor substrate 10L. Optionally, minor finishing and/or planarizing a bottom surface of a thinned semiconductor substrate 10L can be employed. The mirror finishing and/or planarizing the bottom surface of a thinned semiconductor substrate 10L can be implemented by dry etching, dry polishing, wet etching, and/or a combination thereof on the bottom surface of the thinned semiconductor substrate 10L.

The singulation of the semiconductor substrate 10L can be performed by cutting the underfill layer 30 and the semiconductor substrate 10L at once or in several steps along the grooves 12. Optionally, a dicing tape (not shown) can be attached on the underfill layer 30 or on the bottom surface of the semiconductor substrate 10L prior to dicing.

In one embodiment, the method of singulating the semiconductor substrate 10L can be blade dicing. In this case, the singulation is performed by dicing the semiconductor substrate 10L with a blade.

In one embodiment, the singulation of the semiconductor substrate 10L can be performed by dicing the semiconductor substrate 10L from the front side to the back side of the semiconductor substrate 10L, i.e., from the interface between the semiconductor substrate 10L and the dielectric material layer 20 to the surface of the semiconductor substrate 10L that is located on the opposite side of the interface with the dielectric material layer 20. In other words, the dicing is performed by causing the blade to cut through the semiconductor substrate 10L from the front side surface of the semiconductor substrate 10L that is in contact with the dielectric material layer 20 to the back side surface of the semiconductor substrate 10L that is not in contact with the dielectric material layer 20.

A dicing tape can be optionally attached to the bottom surface of the semiconductor substrate 10L prior to dicing. In one embodiment, the semiconductor substrate 10L can be diced in a single dicing without interruption. Alternatively, the semiconductor substrate 10L can be diced by partially blade-dicing the underfill layer 30 and the semiconductor substrate 10L along the direction of the dicing channels (which coincide with the grooves 12), and subsequently cutting the semiconductor substrate 10L along the dicing channels by any of other techniques, which can include, for example, laser irradiation, cleaving by application of stress, and another round of blade dicing.

In one embodiment, the singulation of the semiconductor substrate 10L can be performed by dicing the semiconductor substrate 10L from the back side to the front side of the semiconductor substrate 10L, i.e., from the bottom surface of the semiconductor substrate 10L to the interface between the semiconductor substrate 10L and the dielectric material layer 20. In other words, the dicing is performed by causing the blade to cut through the semiconductor substrate 10L from the back side surface of the semiconductor substrate 10L that is not in contact with the dielectric material layer 20 to the front side surface of the semiconductor substrate 10L that is in contact with the dielectric material layer 20. Optionally, a dicing tape can be attached to the top surface of the underfill layer 30 prior to dicing to prevent scattering of diced semiconductor chips 60 upon singulation. In one embodiment, the semiconductor substrate 10L can be diced in a single dicing without interruption.

During the singulation of the semiconductor substrate 10L by dicing, the dicing of the semiconductor substrate 10L can be performed along all grooves 12 that are present in a lattice pattern on an upper surface of the semiconductor substrate 10L.

In one embodiment, the singulating can be performed partially cutting the semiconductor substrate 10L from an interface with the underfill layer 30 to a depth within the semiconductor substrate 10L that is less than the thickness of the semiconductor substrate 30L. Thus, the semiconductor substrate 10L is partially diced along the grooves 12. Subsequently, a protective tape can be attached to the top surface of the underfill layer 30. Then, the bottom surface of the semiconductor substrate 10L can be polished or ground up to the groove 12 formed in the upper portion of the semiconductor substrate 10L, thereby singulating the remaining portions of the stack of the substrate (10L, 20), the solder balls 40, and the underfill layer 30 into a plurality of semiconductor chips 60 with an array of solder balls 40 and a portion of the underfill layer 30 thereupon. The semiconductor substrate 10L is singulated when a polishing surface reaches the depth of the partial cut in the semiconductor substrate 10L.

Figure 13:
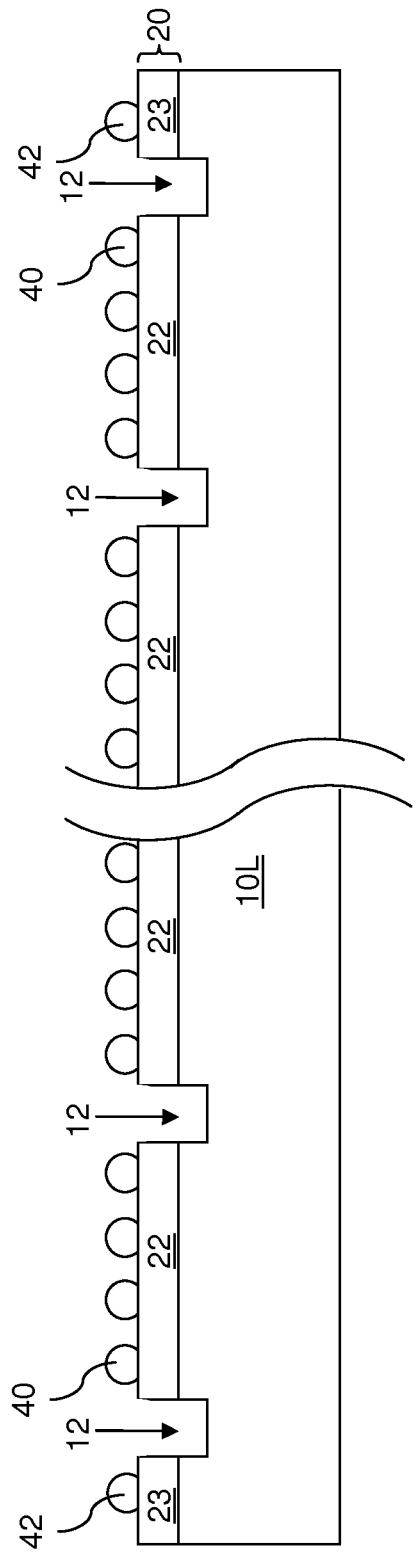
FIG. 13 is a schematic vertical cross-sectional view of a third exemplary structure after formation of solder bumps and dummy solder bumps and formation of grooves by laser ablation according to a third embodiment of the present disclosure.

Referring to FIG. 13, a third exemplary structure according to a third embodiment of the present disclosure is derived from the first exemplary structure of FIG. 2 by forming dummy solder bumps 42 on partial chip metal interconnect structure regions 23 in addition to forming the solder bumps 40 on full chip metal interconnect structure regions 22. Subsequently, the processing steps of FIGS. 3 and 4 are performed to provide the third exemplary structure illustrated in FIG. 13. The dummy solder bumps 42 can be identical to solder bumps 40 except that the dummy solder bumps 42 are formed on partial chip metal interconnect structure regions 23 while the solder bumps 40 are formed on full chip metal interconnect structure regions 22. Correspondingly, the dummy solder bumps 42 do not form a full array of solder bumps required to fully electrically connect the semiconductor devices underlying the partial chip metal interconnect structure regions 23.

Figure 14:
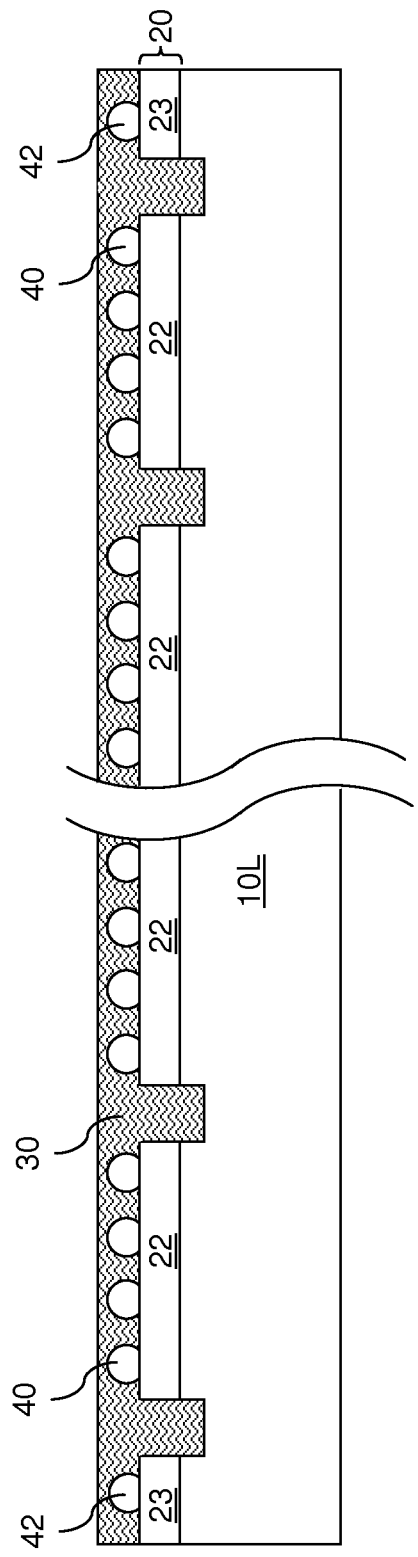
FIG. 14 is a schematic vertical cross-sectional view of the third exemplary structure after formation of an underfill layer according to the third embodiment of the present disclosure.

Referring to FIG. 14, the processing steps of FIG. 5 is performed to form the underfill layer 30. The stack of the semiconductor substrate 10L, the dielectric material layer 20, the arrays of solder bumps 40, and the underfill layer 30 are subsequently singulated employing the arrays of solder bumps 40 and the dummy solder bumps as alignment marks. The thickness of the underfill layer 30 can be controlled such that the topmost surface of the underfill layer 30 is separated from the topmost surfaces of the solder bumps 40 by more than a distance beyond which the solder bumps 40 become invisible. In other words, the thickness of the underfill layer 30 is selected such that the solder bumps 40 and the dummy solder bumps 42 are visible after application of the underfill layer 30.

The singulation process illustrated in FIG. 8 can be subsequently performed employing the solder bumps 40 and the dummy solder bumps 42 as alignment marks during mechanical singulation of the stack of the substrate (10L, 20), the solder balls 40, and the underfill layer 30.

Figure 15:
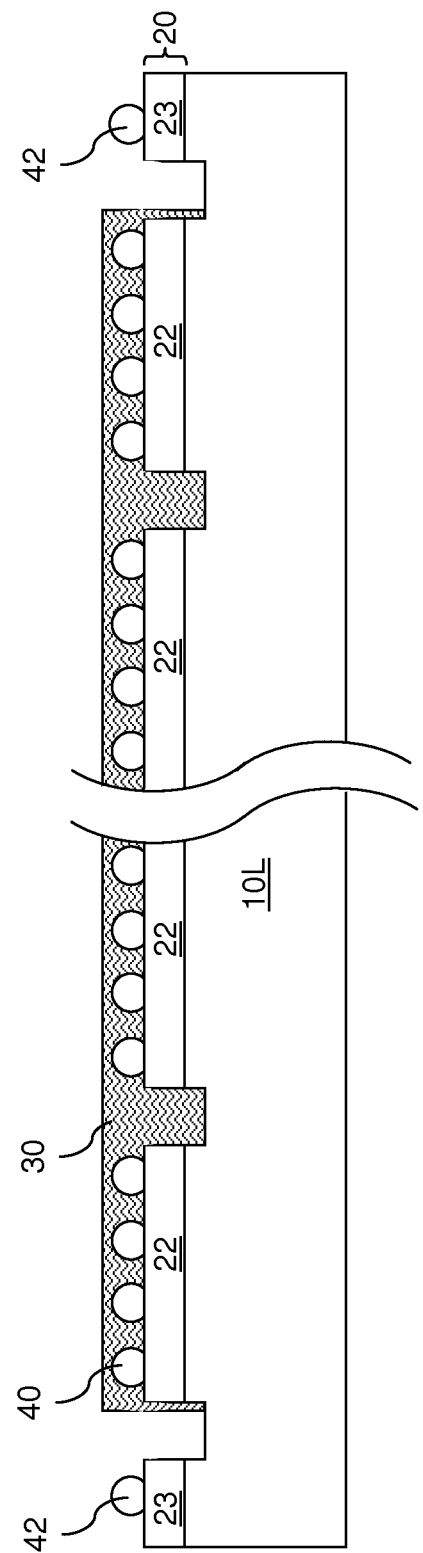
FIG. 15 is a schematic vertical cross-sectional view of a variation of the third exemplary structure after removal of a peripheral portion of the underfill layer around the periphery of the substrate according to the third embodiment of the present disclosure.

Referring to FIG. 15, a variation of the third exemplary structure is derived from the third exemplary structure of FIG. 14 by performing the processing steps of FIGS. 6 and 7 or the processing steps of FIG. 10 followed by removal of the mask layer 34. In this case, some of the dummy solder balls 42 are physically exposed over a peripheral region (or a plurality of physically disjoined peripheral regions) of the substrate (10L, 20). The processing steps of FIG. 8 can be performed employing the physically exposed dummy solder balls 42 as the sole alignment marks, or employing the combination of the physically exposed portions of the grooves 12 and the physically exposed dummy solder balls 42 within the peripheral region (or the plurality of physically disjoined peripheral regions) of the substrate (10L, 20) as alignment marks during the singulation process of FIG. 8.

While the disclosure has been described in terms of specific embodiments, it is evident in view of the foregoing description that numerous alternatives, modifications and variations will be apparent to those skilled in the art. Various embodiments of the present disclosure can be employed either alone or in combination with any other embodiment, unless expressly stated otherwise or otherwise clearly incompatible among one another. Accordingly, the disclosure is intended to encompass all such alternatives, modifications and variations which fall within the scope and spirit of the disclosure and the following claims.

What is claimed is:

1. A method of manufacturing a semiconductor structure, the method comprising:
   forming a dielectric material layer embedding metal interconnect structures on a surface of a semiconductor substrate;
   forming an array of solder balls on a surface of said dielectric material layer;
   forming a groove in said dielectric material layer along a dicing channel by laser irradiation after forming said array of solder balls;
   forming an underfill layer on said dielectric material layer after forming said groove;
   singulating, after forming said underfill layer, said semiconductor substrate into dies by cutting said semiconductor substrate along said dicing channel; and
   bonding said semiconductor substrate to a bonding substrate through a subset of said array of solder balls by reflowing said subset, wherein said bonding substrate is in physical contact with said array of solder balls and said underfill layer after bonding.

2. The method of claim 1, further comprising patterning said underfill layer so that said dicing channel is physically exposed within a peripheral region around a periphery of said semiconductor substrate.

3. The method of claim 2, further comprising aligning a mechanical means for cutting said semiconductor substrate employing physically exposed portion of said groove within said peripheral region as an alignment mark prior to said singulating.

4. The method of claim 2, further comprising:
   applying said underfill layer over an entirety of said semiconductor substrate and said groove; and
   removing a portion of said underfill layer around said periphery after applying said underfill layer.

5. The method of claim 2, further comprising:
   applying a mask layer over said periphery of said semiconductor substrate prior to forming said underfill layer; and
   applying an underfill material within a region bounded by said mask layer, wherein said underfill layer is formed by said applying of said underfill material.

6. The method of claim 1, wherein said singulating is performed by dicing said semiconductor substrate with a blade.

7. The method of claim 1, wherein said groove extends from a portion of a periphery located one side of said semiconductor substrate to another portion of said periphery located at an opposite side of said semiconductor substrate.

8. The method of claim 1, wherein said underfill layer fills said groove upon formation of said underfill layer.

9. The method of claim 1, wherein said forming of said underfill layer is performed after said forming of said groove in said dielectric material layer.

10. The method of claim 1, wherein said underfill layer is formed by employing at least one of
    printing, spin coating, spray coating, squeeze coating, and film lamination of an underfill material.

11. The method of claim 1, further comprising:
    forming solder bumps on said dielectric material layer; and
    aligning a mechanical means for cutting said semiconductor substrate employing a subset of said solder bumps as alignment marks prior to said singulating.

12. The method of claim 1, wherein said dielectric material layer includes a porous dielectric material or air gap.

13. The method of claim 1, further comprising:
    forming solder bumps over said dielectric material layer prior to forming said underfill layer, wherein said underfill layer is formed after said forming of said solder bumps; and
    bonding a die among said dies with a bonding substrate, wherein a portion of said underfill layer is in physical contact with a surface of said bonding substrate.

14. The method of claim 1, further comprising:
    forming metallic pads within said dielectric material layer prior to forming said groove; and
    forming solder bumps on said metallic pads prior to forming said underfill layer.

15. The method of claim 1, further comprising:
    forming a mask layer on over a periphery of said semiconductor substrate after forming said groove and prior to forming said underfill layer; and
    physically exposing a portion of said groove by removing said mask layer after forming said underfill layer and prior to said singulating, wherein said singulating is performed employing said physically exposed portion of said groove as an alignment mark.

16. The method of claim 1, further comprising:
    removing a peripheral portion of said underfill layer after said forming of said underfill layer and prior to said singulating, wherein a portion of said groove is physically exposed after removing said peripheral portion; and
    aligning a mechanical means for cutting said semiconductor substrate employing said physically exposed portion of said groove as alignment marks prior to said singulating.

17. The method of claim 1, further comprising B-staging said underfill layer by heating prior to said singulating.

18. The method of claim 1, wherein all surfaces of said array of solder balls contact said dielectric material layer or said underfill layer after said semiconductor substrate is singulated into said dies and before said semiconductor substrate is bonded to said bonding substrate.

19. The method of claim 1, wherein all surfaces of said array of solder balls contact said dielectric material layer or said underfill layer upon formation of said underfill layer.

20. The method of claim 1, wherein all surfaces of said array of solder balls contact said dielectric material layer, said underfill layer, or said bonding substrate upon bonding of said semiconductor substrate to said bonding substrate.

21. The method of claim 1, wherein a thickness of said underfill layer above a topmost surface of said underfill layer is greater than a height of said array of solder balls upon formation of said underfill layer.

22. The method of claim 1, wherein a planar top surface of said underfill layer is located above topmost surfaces of said array of solder balls.

23. The method of claim 1, wherein said array of solder balls is not attached, temporarily or permanently, to any substrate other than said semiconductor substrate between formation of said array of solder balls and said singulation of said semiconductor substrate into said dies.

24. The method of claim 1, wherein said bonding substrate is pushed through a surface of said underfill layer before contacting said array of solder balls while said semiconductor substrate is bonded to said bonding substrate.

25. The method of claim 1, wherein said underfill layer includes an underfill material that is deformed during bonding of said semiconductor substrate with said bonding substrate.

* * * * *